Dec. 25, 1951 B. N. FISHER 2,579,659

CONTROL AND DIAL ARRANGEMENT FOR MULTIBAND TUNING UNITS

Filed Jan. 20, 1950 2 SHEETS—SHEET 1

INVENTOR.
BERNE N. FISHER
BY James and Franklin
ATTORNEYS

CONTROL AND DIAL ARRANGEMENT FOR MULTIBAND TUNING UNITS

Filed Jan. 20, 1950

INVENTOR.
BERNE N. FISHER
BY James and Franklin
ATTORNEYS

Patented Dec. 25, 1951

2,579,659

UNITED STATES PATENT OFFICE 2,579,659

CONTROL AND DIAL ARRANGEMENT FOR MULTIBAND TUNING UNITS

Berne N. Fisher, Roselle, N. J., assignor to General Instrument Corporation, Elizabeth, N. J., a corporation of New Jersey Application January 20, 1950, Serial No. 139,733

21 Claims. (Cl. 116—124.1)

The present invention relates to a multiband tuning unit and in particular to a dial-indicator assembly in combination with controls therefor so interrelated as to achieve optimum efficiency and ease in band selection and accurate tuning within the band.

Many types of tuning units require tuning over such a wide frequency spectrum that continuous tuning is impractical. Multiband tuning has therefore been adopted. Thus a shift from standard broadcast frequencies to shortwave broadcast frequencies, or to frequency modulated broadcast frequencies, requires a corresponding shift in the tuning apparatus, generally accomplished by actuation of a separate control member denominated the "band selector member" and provided with cooperating indicia, one for each of the bands to be selected.

In television tuning units the same problem has presented itself, it having been found impractical in many instances to provide a single tuning unit capable of continuous variation over the entire spectrum of television frequencies. Accordingly it has been found desirable, in order to reduce the size and cost of television tuning units and at the same time to increase their accuracy and efficiency, to provide a continuously variable tuning element cooperable with a tuning element variable in a step by step manner, the continuously variable element being capable of tuning the unit over one portion of the television spectrum when the other tuning element has one value and over the remainder of the television spectrum when the other tuning element is varied in a step-wise manner so as to have another value.

Control of these two tuning elements presents a serious problem, particularly when it is realized that receiving sets embodying such units are adapted for mass consumption and consequently are to be used by individuals with little or no electrical or mechanical skill. An array of switches and controls, while perhaps imposing and awe inspiring, does not have the appeal necessary for quantity sales. The public demands simplicity, and any impression that the controls are complicated mitigates against the saleability of a given television set, perhaps because complex controls imply difficulty in obtaining proper reception.

Another factor involved is that of visibility of the tuning indicator and the indicia-bearing scale cooperable therewith. Even when separate and distinct bands, such as the amplitude modulation and frequency modulation bands, are to be selectively tuned, the modern tendency is to have the sets of indicia representing the respective bands simultaneously visible. Many set manufacturers, in an effort to avoid confusion of one scale with another, have utilized movable masks, movable scales or adjustable illumination to indicate in some manner which of the various sets of indicia is the one to be observed in conjunction with the indicator. A separate band selection switch has been employed and selection of the proper set of indicia on the scale was merely incident to the setting of the switch in accordance with the individual indicia cooperable therewith. In other words, in these prior art arrangements the band selection switch is positioned according to its indicia, the sets of indicia on the scale which cooperates with the indicator being distinct from the indicia for the switch and being selectable, if at all, solely as an incident to the proper setting of the band selection switch.

In television tuning, however, it is almost a necessity that a scale showing the entire television spectrum be visible at one time, in order that the user of the set may be constantly apprised of the number of channels available to him. Since these channels are consecutively numbered, it is also desirable that the scale indicate those channels in their consecutive order in an unbroken and continuous sequence so that tuning can be as simple an operation as possible.

When a television tuning unit is, for the reasons set forth above, divided into two tuning bands, tuning in each band being continuous but tuning from band to band being discontinuous and requiring the actuation of an additional control member, simplification of the controls and the correlation of those controls with a suitable scale-indicator combination for indicating the tuning status of the device is a matter of considerable importance, both from an engineering and a commercial point of view. The present invention has for its prime object the simplification of the controls by means of a novel mode of cooperation between the controls, the indicator and the scale. The band selection switch is actuated by a control member which is not only coaxially mounted with respect to the control member for tuning within a given band, but is also operatively connected to the scale with which the indicator functions, the indicator being operatively connected to the control member which tunes continuously within the selected band. No separate indicia are provided for the control member which actuates the band selection switch, the sets of indicia on the moveable scale itself being utilized to indicate the selected band and being so positioned on the scale as to facilitate manipulation of said control member in the most natural manner possible. If the control member for tuning within the selected band is incapable of tuning a desired frequency, that fact will be indicated by the inability of the indicator to reach the desired position with respect to the scale. Movement of the scale to permit the indicator to reach that position, which movement is accomplished through appropriate actuation of the band-selection control member, will automatically condition the tuning unit to tune within the appropriate band. Consequently, although two control members are still required, both can be loosely denominated as tuning members, and there is no band selector control as such, that is to say, the user of the tuning unit merely positions the indicator with respect to the scale, as in a single band tuning unit, and does not consciously have a separate switch to operate in order to select different bands of frequencies within the television spectrum.

This arrangement has obvious psychological advantages which render it extremely significant from a merchandising point of view. The tuning unit may be inexpensive without sacrifice of accuracy, the controls are compact and easily manipulated, and no skill is required for their actuation. The indicator and scale so cooperate that it is impossible for the operator to be tuning within one band when he mistakenly believes that he is tuning within another, and hence well nigh fool-proof operation is achieved.

To the attainment of the above objects and to such other objects as may hereinafter appear, the present invention relates to a control and indicator arrangement for a multiband tuning unit as defined in the appended claims and as described in this specification taken together with the accompanying drawings in which:

Figures 1, 2, 3:
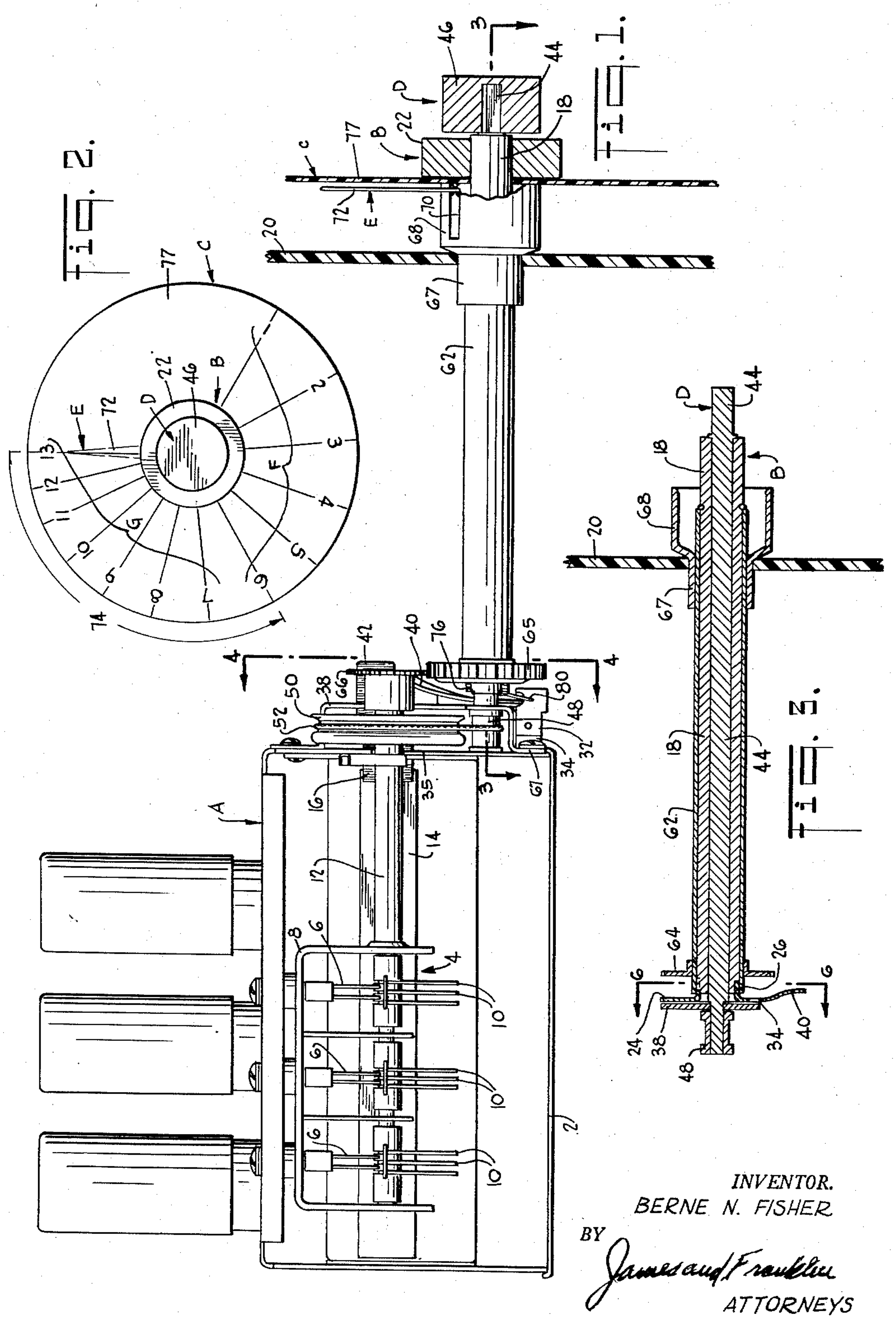
Fig. 1 is a side elevational view of a television tuning unit embodying the present invention.
Fig. 2 is a front view of the dials, scale and indicator thereof.
Fig. 3 is a cross-sectional view taken along the line 3—3 of Fig. 1.

Broadly considered the present invention utilizes, in conjunction with a television tuning unit generally designated A, a first control member B for band selection, to which a scale generally designated C is operatively connected for movement therewith, and a second control member generally designated D for tuning within a given band, an indicator E being operatively connected thereto for movement therewith. The scale C carries two sets of indicia generally designated F and G, those sets representing the tuning range within each of the bands selected by the first control member B. These sets of indica F and G are arranged in sequence on the scale C and are adapted to be moved, through appropriate actuation of the first control member B, into operative position with respect to the indicator E, that indicator being so positioned with respect to the scale C as to indicate the tuning status of the tuning unit.

The invention is here described with particular reference to a television tuning unit capable of tuning over the entire television spectrum in two discrete bands, but it will be understood that the invention is applicable also to other arrangements, an increased number of bands, and other tuning units.

The tuning unit A comprises a chassis 2 within which a rotary variable condenser generally designated 4 is mounted, that condenser comprising a pluarilty of sets of stator plates 6 fixedly mounted on frame 8 and a plurality of sets of rotor plates 10 mounted on shaft 12 rotatable in frame 8 so as to variably interleave with the stator plates 6 as the shaft 12 is rotated. The condenser 4 has a range of capacity variation which is capable, in conjunction with other tuning units such as inductor coils (not shown) to which it is electrically connected, to tune over one portion of the television spectrum. Accordingly two sets of coils are provided, the condenser 4 being connectable to one or the other of the coil sets by means of a switch of any appropriate construction housed within casing 14 and actuated by a movable element such as the slide bar 16. The inductances of the coils in the several sets are so chosen that when one set is connected to the condenser 4 one portion of the television spectrum can be tuned and when the other set is connected to the condenser 4 the remainder of the television spectrum may be tuned. The coil structure, the manner of connection of the coils to the condenser 4, and the particular construction of the switch housed within the casing 14 are all conventional and may be widely varied, and hence are not here shown in any detail.

Figures 4, 5, 6:
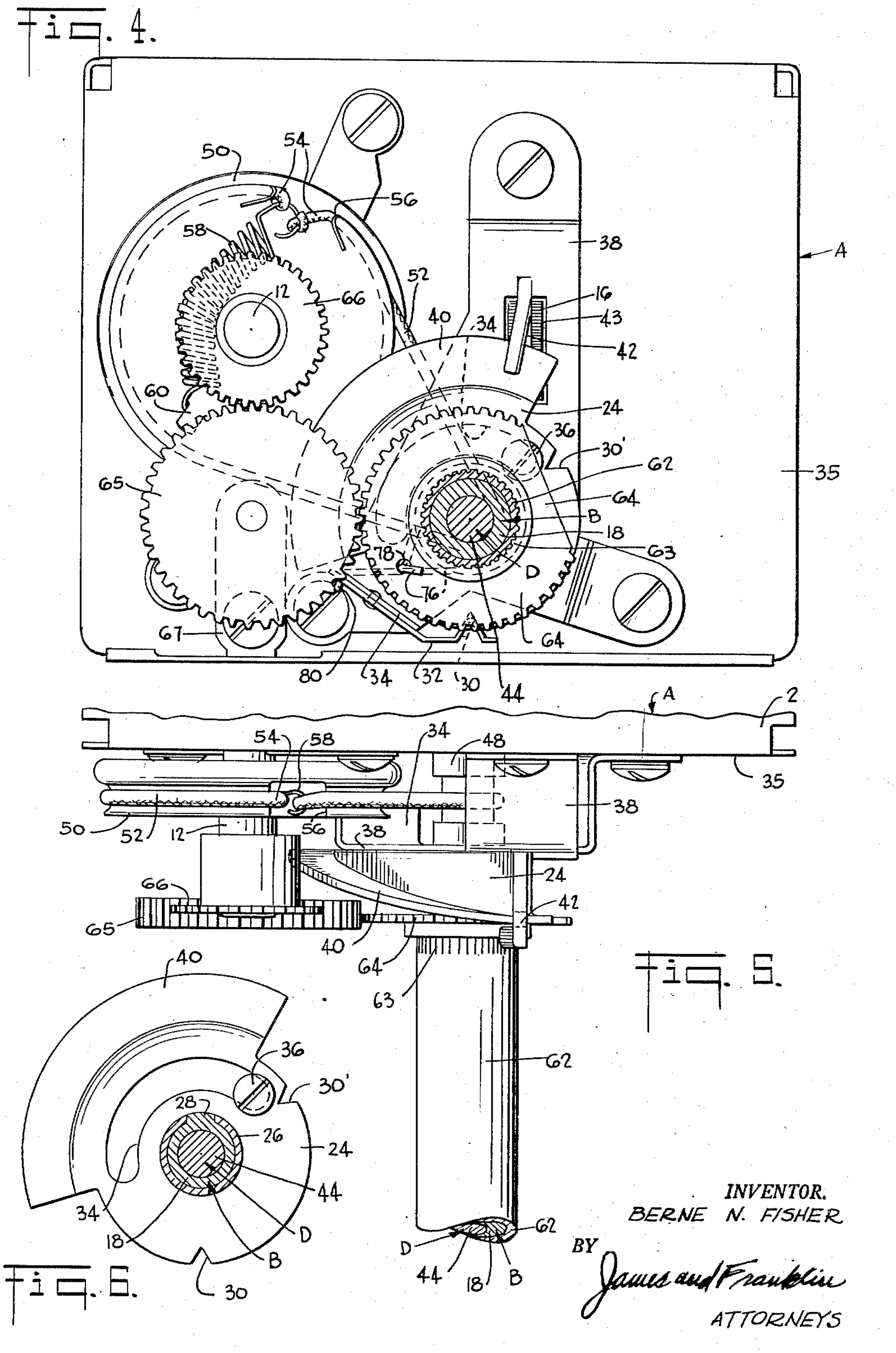
Fig. 4 is an end view taken along the line 4—4 of Fig. 1.
Fig. 5 is a top view on an enlarged scale showing the gear assembly of the tuning unit.
Fig. 6 is a detailed view on an enlarged scale taken along the line 6—6 of Fig. 3, showing the band selection cam.

The first control member B, which achieves band selection, positions the slide rod 16 and thus controls the switch housed within the casing 14 so as to connect the condenser 4 to the set of coils appropriate to the desired band. The first control member B comprises a shaft 18 which extends from the chassis 2 out through the panel 20 of the receiving set cabinet, a knob 22 being secured thereto in any appropriate manner. At its inner end it carries a plate 24 having a hub 26 (see Fig. 6) which is keyed to the shaft 18 at 28, and which has a pair of peripheral notches 30, 30′ cooperable with a leaf spring 32 secured to a bracket 34 attached to the end plate 35 of the chassis 2. The plate 24 also has an arcuate opening 34 through which screw 36 is receivable, the screw being mounted in bracket 38 secured to the chassis end plate 35. Hence the first control member B is movable between two positions as defined by the detenting action of the spring 32 within the peripheral notches 30 and 30′ respectively and as permitted by the screw 36 cooperating with the arcuate opening 34. On the plate 24 is an inclined cam 40 which is grasped by the forked end 42 of the slide bar 16 which extends out through aperture 43 in the bracket 38, the positioning of the plate 24 in one or the other of its rotative positions as defined by the interaction between the spring 32 and the peripheral notches 30 and 30′ moving the slide bar 16 in or out and thus actuating the switch housed within the casing 14 to connect the condenser 4 to an appropriate set of inductor coils. It will therefore be apparent that rotation of the knob 22 to position the shaft 18 will result in band selection.

The second control member D comprises shaft 44 which is concentrically mounted inside the shaft 18 so as to be independently rotatable, the inner end of this shaft being rotatably mounted in bracket 38, thus supporting the inner end of the shaft 18 as well, the outer end of the shaft 44 passing through the panel 20, extending out beyond the outer end of the shaft 18, and having a knob 46 secured thereto. The inner end of the shaft 44 carries a pulley 48 and the shaft 12 of the condenser 4 extends out through the chassis end plate 35 and has another and larger pulley 50 secured thereto. A cord 52 passes around the pulleys 48 and 50, the ends 54 of the cord 52 passing down through an aperture 56 in the rim of the pulley 50 and there being secured to one end of the spring 58, the other end of that spring being attached to an inbent lug 60 on the body of the pulley 50. The spring 58 tensions the cord 52 so that rotation of the shaft 44 through manipulation of the knob 46 will impart rotation to the shaft 12 of the condenser 4 and thus cause the rotor plates 10 of the condenser 4 to move with respect to the stator plates 6 thereof so as to tune the unit within the selected band.

A third shaft 62 is mounted concentric with the shafts 18 and 44 but outside of those shafts, shaft 62 being independently rotatable. A gear 64 is secured to the inner end thereof as by means of the splines 63, that gear meshing with gear 65 journaled on bracket 67, the gear 65 in turn meshing with pinion 66 which is secured to the shaft 12. At its outer end the shaft 62 is provided with a collar 67 journaled in the panel 20, thus supporting not only the outer end of the shaft 62 but also the outer ends of the shafts 18 and 44. The collar 67 is provided with an enlarged outer portion 68 provided with a slot 70 in which the indicator E, in the form of a pointer 72, is mounted. It therefore will be apparent that motion of the condenser shaft 12 will be transmitted to the pointer 72, but, by reason of the gear train defined by pinion 66 and gears 65 and 64, the degree of rotation of the pointer 72 will be less than the degree of rotation of the shaft 12. As is the case in conventional rotary variable condensers, the shaft 12 may be rotated over approximately 180°, and the gear train is so designed that the pointer 72 has a limited degree of movement of approximately 120°, being movable over the arc 74 of Fig. 2. In order to prevent any backlash between the shaft 12 and the pointer 72, and thus in order to ensure that the pointer 72 will always accurately indicate the tuning status of the unit, a coil spring 76 is provided (see Fig. 4) one end of which is engaged with the gear 64, as by passing through an aperture 78 therein, the body of the spring being wrapped around the inwardly protruding end of the shaft 62 and the other end 80 being fixedly engaged with the spring 32. The spring 76 exerts a constant torque on the gear 64 thus taking up any backlash in the gear train.

The scale C is secured directly to the shaft 18 so as to be rotatable therewith and so as to be directly in front of the pointer 72 which constitutes the indicator E, the scale C being in the form of a plate 77 of some transparent material on the face of which the sets of indicia F and G are marked, the set F as here disclosed constituting channels 1 through 6 of the television spectrum and set G constituting channels 7 through 13 thereof. It would be possible of course, through appropriate modification of the respective shafts, to position the indicator E in front of the scale C, in which case transparency of the scale C would not be essential. The angular extent of each of the sets of indicia F and G is equal to the limited degree of arcuate movement of the indicator E, to wit, 120°, and it will be noted from Fig. 2 that the sets F and G are positioned immediately adjacent one another and that the channel designations are consecutively arranged from 1 to 13. Thus the scale and indicator assembly has the identical appearance as though the unit were tunable over the entire television spectrum in a continuous manner and without any band selection whatsoever. The concentric mounting of the knobs 22 and 46 heightens this effect and gives the impression that no band selection switch is present.

The tuning of the unit described above is a simple and straightforward operation. With the scale C in the position shown in Fig. 2 rotation of the knob 46 will cause the unit to tune in that portion of the television spectrum in which channels 7 through 13 are to be found. Because of the relative sizes of the pulleys 48 and 50 a large angular movement of the knob 46 results in a small angular movement of the condenser shaft 12 and consequently tuning can be accomplished with great precision. In the course of tuning the pointer 72 which constitutes the indicator E will be moved over the arc 74 and thus will come into operative position with respect to the indicia for channels 7 through 13 consecutively as the knob 46 is continuously rotated in a given direction. When the condenser shaft 12 has been rotated through its permitted 180° of rotation any further rotation of the knob 46 will encounter resistance which can be felt by the operator, and the pulley 48 will slip with respect to the cord 52 so that no damage to the structure will result if the knob 46 is rotated too far or too hard. No further motion of the pointer 72 will result. It will thus be apparent to the operator that he has gone as far as he can go with knob 46 alone, but if he wishes to tune the other portion of the television spectrum comprising channels 1 through 6 he need merely shift his hand slightly to the knob 22 and rotate that knob in such a direction that the set of indicia G is brought into registration with the pointer 72. This rotation is continued until the spring 32 makes a detented engagement with the appropriate peripheral notch 30', thus actuating the slide bar 16, by means of the interengagement between its forked end 42 and the cam 40, to connect the condenser 4 to another set of inductor coils. This will bring the pointer 72 at one end of the set of indicia F, and rotation of the knob 46 in the opposite direction from which it was previously rotated will cause the set to tune through the other portion of the television spectrum and will correspondingly cause the pointer 72 to move across the set of indicia F corresponding to the television channels in that portion of the spectrum.

Since the scale C is directly connected to the shaft 18 it will rotate in the same direction as the knob 22. By reason of the gear train comprising the pinion 66, the gear 65 and the gear 64, the shaft 62, and with it the pointer 72, will rotate in the same direction as the knob 46. Consequently, control of the interaction between the scale C and the indicator E is direct and natural, no particular thought being required on the part of the operator in order to bring the proper indicia set F or G into registration with the indicator E. The position of the indicator E with respect to any given mark in the operatively positioned indicia set F or G will directly indicate the way in which the knob 46 should be turned for further tuning, and when that knob 46 can be turned no further, the direction in which the knob 22 must be rotated in order to bring the remainder of the scale C into operative position with respect to the indicator E will also be clearly apparent.

The control structure itself is compact, simple, inexpensive, accurate and relatively foolproof. The interrelationship between the control members B and D, the scale C and the indicator E are such that multiband tuning is achieved without complicating the appearance of the unit and without making obvious the fact that band selection is required.

It will be obvious that many variations may be made in the structure of the disclosed tuning unit without departing from the spirit of the invention as defined in the following claims.

I claim:

1. A multiband tuning unit comprising a first control member for band selection, a second control member for tuning within the band, an indicator operatively connected to said second control member for movement therewith over a limited degree of movement, and a scale operatively positioned with respect to said indicator so that the position of said indicator with respect to said scale will indicate the tuning status of the unit and operatively connected to said first control member for movement therewith, said scale bearing sets of indicia corresponding to the band selected by said second control member, said sets being spaced along separate sections of said scale, all of said sets being simultaneously visible, and said scale being movable by said first control member to bring the appropriate one of said sections into operative relation to said indicator.

2. A multiband tuning unit comprising a first control member for band selection, a second control member for tuning within the band, an indicator operatively connected to said second control member for movement therewith over a limited degree of movement, and a scale operatively positioned with respect to said indicator so that the position of said indicator with respect to said scale will indicate the tuning status of the unit and operatively connected to said first control member for movement therewith, said scale bearing sets of indicia corresponding to the band selected by said second control member, said sets being positioned in line on said scale, each of said sets having a length corresponding to the degree of movement of said indicator, all of said sets being simultaneously visible and said scale being movable by said first control member to bring the appropriate one of said sets into operative relation to said indicator.

3. A multiband tuning unit comprising a first control member for band selection, a second control member for tuning within the band, an indicator pivotally mounted on said unit and operatively connected to said second control member so as to be pivoted over a limited degree of movement by movement of said second control member, and a scale having sets of indicia corresponding to the band selected by said second member, said sets being arranged over separate arcs on said scale, said arcs being concentric with the pivotal axis of said indicator, said scale being operatively positioned with respect to said indicator so that the position of said indicator with respect to said scale will indicate the tuning status of the unit, and said scale being operatively connected to said first control member and pivotally mounted on said unit so as to be movable to bring the approprite one of said arcs into operative relation to said indicator.

4. A multiband tuning unit comprising a first control member for band selection, a second control member for tuning within the band, an indicator pivotally mounted on said unit and operatively connected to said second control member so as to be pivoted over a limited degree by movement of said second control member, and a scale having sets of indicia corresponding to the band selected by said second member, said sets being arranged over separate arcs on said scale, said arcs being non-overlapping and defining one continuous arc concentric with the pivotal axis of said indicator, said scale being operatively positioned with respect to said indicator so that the position of said indicator with respect to said scale will indicate the tuning status of the unit, and said scale being operatively connected to said first control member and pivotally mounted on said unit so as to be movable to bring the appropriate one of said arcs into operative relation to said indicator.

5. A multiband tuning unit comprising a first control member for band selection, a second control member for tuning within the band, an indicator pivotally mounted on said unit and operatively connected to said second control member so as to be pivoted over a limited degree by movement of said second control member, and a scale having sets of indicia corresponding to the band selected by said second member, said sets being arranged over separate arcs on said scale, said arcs being non-overlapping and defining one continuous arc concentric with the pivotal axis of said indicator, all of said sets being simultaneously visible, said scale being operatively positioned with respect to said indicator so that the position of said indicator with respect to said scale will indicate the tuning status of the unit, and said scale being operatively connected to said first control member and pivotally mounted on said unit so as to be movable to bring the appropriate one of said arcs into operative relation to said indicator.

6. A multiband tuning unit comprising a first control member for band selection, a second control member for tuning within the band, an indicator pivotally mounted on said unit and operatively connected to said second control member so as to be pivoted over a limited degree of movement by movement of said second control member, and a scale having sets of indicia corresponding to the band selected by said second member, said sets being arranged over separate non-overlapping adjacent arcs on said scale defining one continuous arc, said scale being operatively positioned with respect to said indicator so that the position of said indicator with respect to said scale will indicate the tuning status of the unit, and said scale being operatively connected to said first control member and mounted on said unit so as to be pivotable through an angle substantially equal to the limited degree of movement of said indicator to bring the appropriate one of said arcs into operative relation to said indicator.

7. A multiband tuning unit comprising a first control member for band selection, a second control member for tuning within the band, an indicator pivotally mounted on said unit and operatively connected to said second control member so as to be pivoted over a limited degree of movement by movement of said second control member, and a scale having sets of indicia corresponding to the band selected by said second member, said sets being arranged over separate non-overlapping adjacent arcs on said scale defining one continuous arc, all of said sets being simultaneously visible, said scale being operatively positioned with respect to said indicator so that the position of said indicator with respect to said scale will indicate the tuning status of the unit, and said scale being operatively connected to said first control member and mounted on said unit so as to be pivotable through an angle substantially equal to the limited degree of movement of said indicator to bring the appropriate one of said arcs into operative relation to said indicator.

8. A multiband tuning unit comprising a first control member for band selection, a second control member for tuning within the band, an indicator pivotally mounted on said unit and operatively connected to said second control member so as to be pivoted over a limited degree of movement by movement of said second control member, and a scale having sets of indicia corresponding to the band selected by said second member, said sets being arranged over separate arcs on said scale, said scale and said indicator being positioned one in front of the other so that the position of said indicator with respect to said scale will indicate the tuning status of the unit, and said scale being operatively connected to said first control member and pivotally mounted on said unit so as to be pivotable through an angle substantially equal to the limited degree of movement of said indicator to bring the appropriate one of said arcs into operative relation to said indicator.

9. A multiband tuning unit comprising a first control member for band selection, a second control member for tuning within the band, an indicator pivotally mounted on said unit and operatively connected to said second control member so as to be pivoted over a limited degree of movement by movement of said second control member, and a scale having sets of indicia corresponding to the band selected by said second member, said sets being arranged over separate arcs on said scale, said arcs being non-overlapping and defining one continuous arc, said scale and said indicator being positioned one in front of the other so that the position of said indicator with respect to said scale will indicate the tuning status of the unit, and said scale being operatively connected to said first control member and pivotally mounted on said unit so as to be pivotable through an angle substantially equal to the limited degree of movement of said indicator to bring the appropriate one of said arcs into operative relation to said indicator.

10. A multiband tuning unit comprising a first control member for tuning within the band, an indicator pivotally mounted on said unit and operatively connected to said second control member so as to be pivoted over a limited degree of movement by movement of said second control member, and a scale having sets of indicia corresponding to the band selected by said second member, said sets being arranged over separate arcs on said scale, said arcs being non-overlapping and defining one continuous arc concentric with the pivotal axis of said indicator, said scale and said indicator being positioned one in front of the other so that the position of said indicator with respect to said scale will indicate the tuning status of the unit, and said scale being operatively connected to said first control member and pivotally mounted on said unit so as to be pivotable through an angle substantially equal to the limited degree of movement of said indicator to bring the appropriate one of said arcs into operative relation to said indicator.

11. A multiband tuning unit comprising a first control member for band selection, a second control member for tuning within the band, an indicator pivotally mounted on said unit and operatively connected to said second control member so as to be pivoted over a limited degree of movement by movement of said second control member, and a scale having sets of indicia corresponding to the band selected by said second member, said sets being arranged over separate arcs on said scale, said arcs being non-overlapping and defining one continuous arc concentric with the pivotal axis of said indicator and all of said sets being simultaneously visible, said scale and said indicator being positioned one in front of the other so that the position of said indicator with respect to said scale will indicate the tuning status of the unit, and said scale being operatively connected to said first control member and pivotally mounted on said unit so as to be pivotable through an angle substantially equal to the limited degree of movement of said indicator to bring the appropriate one of said arcs into operative relation to said indicator.

12. A multiband tuning unit comprising a first control member for band selection, a second control member for tuning within the band, an indicator pivotally mounted on said unit and operatively connected to said second control member so as to be pivoted over a limited degree of movement by movement of said second control member, and a scale having sets of indicia corresponding to the band selected by said second member, said sets being arranged over separate arcs on said scale, said scale and said indicator being positioned one in front of the other so that the position of said indicator with respect to said scale will indicate the tuning status of the unit, said scale being mounted on said unit so as to be pivotable about the same axis as said indicator, and said scale being operatively connected to said first control member so as to be movable to bring the appropriate one of said arcs into operative relation to said indicator.

13. A multiband tuning unit comprising a first control member for band selection, a second control member for tuning within the band, an indicator pivotally mounted on said unit and operatively connected to said second control member so as to be pivoted over a limited degree of movement by movement of said second control member, and a scale having sets of indicia corresponding to the band selected by said second member, said sets being arranged over separate arcs on said scale, said arcs being non-overlapping and defining one continuous arc concentric with the pivotal axis of said indicator, said scale and said indicator being positioned one in front of the other so that the position of said indicator with respect to said scale will indicate the tuning status of the unit, said scale being mounted on said unit so as to be pivotable about the same axis as said indicator, and said scale being operatively connected to said first control member so as to be movable to bring the appropriate one of said arcs into operative relation to said indicator.

14. A multiband tuning unit comprising a first control member for band selection, a second control member for tuning within the band, an indicator pivotally mounted on said unit and operatively connected to said second control member so as to be pivoted over a limited degree of movement by movement of said second control member, and a scale having sets of indicia corresponding to the band selected by said second member, said sets being arranged over separate arcs on said scale, said arcs being non-overlapping and defining one continuous arc concentric with the pivotal axis of said indicator, and all of said sets being simultaneously visible, said scale and said indicator being positioned one in front of the other so that the position of said indicator with respect to said scale will indicate the tuning status of the unit, said scale being mounted on said unit so as to be pivotable about the same axis as said indicator, and said scale being operatively connected to said first control member so as to be movable to bring the appropriate one of said arcs into operative relation to said indicator.

15. A multiband tuning unit comprising a first shaft for controlling band selection, a second shaft for tuning within the band, said first and second shafts being coaxially mounted on said unit, a third shaft coaxially mounted with respect to said first and second shafts and operatively connected to said second shaft for rotation therewith over a limited degree of movement, an indicator carried by said third shaft, and a scale operatively positioned with respect to said indicator so that the position of said indicator with respect to said scale will indicate the tuning status of said unit and operatively connected to said first shaft for movement therewith, said scale bearing sets of indicia corresponding to the band selected by said second shaft, said sets being positioned in line on said scale, each of said sets having a length corresponding to the limited degree of movement of said indicator, and said scale being movable by said first shaft to bring the appropriate one of said sections into operative relation to said indicator.

16. The multiband tuning unit of claim 15 in which said second shaft is mounted inside said first shaft.

17. The multiband tuning unit of claim 15 in which said third shaft is mounted outside said first and second shafts.

18. The multiband tuning unit of claim 15 in which said second shaft is mounted inside said first shaft, and in which said third shaft is mounted outside said first and second shafts.

19. The multiband tuning unit of claim 15 in which said scale is carried by and is rotatable with said first shaft.

20. The multiband tuning unit of claim 15 in which motion-reduction means is interposed between said second shaft and said indicator for reducing the angular motion of said indicator with respect to said second shaft, and in which said scale is carried by and is rotatable with said first shaft.

21. A multiband tuning unit comprising a first shaft for controlling band selection, a second shaft for tuning within the band, said first and second shafts being coaxially mounted on said unit, an indicator operatively connected to said second shaft through motion-reduction means for movement with said second shaft over a limited degree of movement less than the angular movement of said second shaft, and a scale carried by and rotatable with said first shaft and operatively positioned with respect to said indicator so that the position of said indicator with respect to said scale will indicate the tuning status of said unit, said scale bearing sets of indicia corresponding to the band selected by said second shaft, said sets being positioned in line on said scale, each of said sets having a length corresponding to the degree of movement of said indicator, and said scale being movable by said first shaft to bring the appropriate one of said sections into operative relation to said indicator.

BERNE N. FISHER.

REFERENCES CITED

The following references are of record in the file of this patent:

UNITED STATES PATENTS

| Number | Name | Date |
|---|---|---|
| 2,042,061 | Karlin | May 26, 1936 |
| 2,124,023 | Albright et al. | July 19, 1938 |
| 2,132,094 | Brodton | Oct. 4, 1938 |
| 2,146,558 | Beck | Feb. 7, 1939 |
| 2,176,673 | Kraus | Oct. 7, 1939 |
| 2,193,107 | Maris | Mar. 12, 1940 |
| 2,344,825 | Lear | Mar. 21, 1944 |
| 2,437,306 | Ramsay | Mar. 9, 1948 |